United States Patent
Eom et al.

(10) Patent No.: US 9,899,075 B2
(45) Date of Patent: Feb. 20, 2018

(54) MULTI CHANNEL SEMICONDUCTOR DEVICE HAVING MULTI DIES AND OPERATION METHOD THEREOF

(71) Applicant: Samsung Electronics Co., Ltd., Suwon-si (KR)

(72) Inventors: Yoon-Joo Eom, Hwaseong-si (KR); Joon-Young Park, Seoul (KR); Yongcheol Bae, Yongin-si (KR); Won Young Lee, Seongnam-si (KR); Seongjin Jang, Seongnam-si (KR); Junghwan Choi, Hwaseong-si (KR); Joosun Choi, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/795,191

(22) Filed: Jul. 9, 2015

(65) Prior Publication Data
US 2016/0012879 A1 Jan. 14, 2016

(30) Foreign Application Priority Data
Jul. 9, 2014 (KR) ........................ 10-2014-0086188

(51) Int. Cl.
| | |
|---|---|
| G11C 5/06 | (2006.01) |
| G11C 11/4096 | (2006.01) |
| G11C 11/4093 | (2006.01) |
| G11C 7/10 | (2006.01) |

(52) U.S. Cl.
CPC ........ *G11C 11/4096* (2013.01); *G11C 7/1084* (2013.01); *G11C 11/4093* (2013.01); *G11C 2207/105* (2013.01)

(58) Field of Classification Search
CPC ........... G11C 5/02; G11C 5/06; G11C 7/1048; G11C 7/1051
See application file for complete search history.

(56) References Cited

U.S. PATENT DOCUMENTS

| | | | |
|---|---|---|---|
| 6,114,885 A | 9/2000 | Yang et al. | |
| 6,188,237 B1 | 2/2001 | Suzuki et al. | |
| 6,281,578 B1 | 8/2001 | Lo et al. | |
| 6,414,904 B2 | 7/2002 | So et al. | |

(Continued)

FOREIGN PATENT DOCUMENTS

| | | |
|---|---|---|
| JP | 2012-253485 | 12/2012 |
| KR | 10-1995-0002001 A | 1/1995 |

(Continued)

*Primary Examiner* — Andrew Q Tran
(74) *Attorney, Agent, or Firm* — Muir Patent Law, PLLC

(57) ABSTRACT

A multi channel semiconductor device is disclosed. The multi channel device may include a substrate, a first die on the substrate and having a first channel to function as a first chip; and a second die on the substrate and having a second channel different from the first channel to function as a second chip and including the same storage capacity and physical size as the first die. An internal interface is disposed between the first and second dies. The internal interface is configured to transmit information for controlling internal operations of the first and second dies and first applied to a first recipient die of the first and second dies to the other die.

10 Claims, 14 Drawing Sheets

(56) References Cited

U.S. PATENT DOCUMENTS

| | | |
|---|---|---|
| 6,947,336 B2 | 9/2005 | Kim et al. |
| 7,034,382 B2 | 4/2006 | Palmteer et al. |
| 7,123,497 B2 | 10/2006 | Matsui et al. |
| 7,269,043 B2 | 9/2007 | Lee |
| 7,624,310 B2 * | 11/2009 | Porterfield .......... G06F 13/4243 370/503 |
| 7,894,230 B2 | 2/2011 | Kim |
| 7,990,174 B2 | 8/2011 | Park |
| 7,994,813 B2 | 8/2011 | Sohn et al. |
| 8,031,539 B2 | 10/2011 | Gregorius |
| 8,344,752 B2 | 1/2013 | Song |
| 8,717,828 B2 * | 5/2014 | Kim .................. G11C 5/063 365/189.011 |
| 8,749,267 B2 * | 6/2014 | Riho .............. H03K 19/018521 326/21 |
| 9,209,160 B2 * | 12/2015 | Lee .................... H01L 25/0657 |
| 2002/0031856 A1 | 3/2002 | Lee et al. |
| 2009/0008799 A1 | 1/2009 | Lee et al. |
| 2010/0164540 A1 | 7/2010 | Kwean |
| 2011/0193086 A1 | 8/2011 | Lee et al. |
| 2012/0137040 A1 | 5/2012 | Kim et al. |
| 2012/0269489 A1 | 10/2012 | Park et al. |
| 2013/0049223 A1 | 2/2013 | Nomoto et al. |
| 2013/0093492 A1 | 4/2013 | Riho |
| 2013/0208524 A1 * | 8/2013 | Sung ........................ G11C 5/04 365/63 |
| 2013/0320557 A1 | 12/2013 | Lai |
| 2014/0011300 A1 | 1/2014 | Kim |

FOREIGN PATENT DOCUMENTS

| | | |
|---|---|---|
| KR | 10-1995-0004479 A | 2/1995 |
| KR | 10-0163863 B1 | 9/1998 |
| KR | 10-0336481 B1 | 5/2002 |
| KR | 10-1352814 B1 | 1/2004 |
| KR | 10-2006-0005713 A | 1/2006 |

* cited by examiner

MULTI CHANNEL SEMICONDUCTOR DEVICE HAVING MULTI DIES AND OPERATION METHOD THEREOF

CROSS-REFERENCE TO RELATED APPLICATIONS

This U.S. non-provisional patent application claims priority under 35 U.S.C. § 119 to Korean Patent Application No. 10-2014-0086188, filed on Jul. 9, 2014, the entire contents of which are hereby incorporated by reference.

BACKGROUND

1. Field

The present disclosure relates to semiconductor devices, and more particularly, to a semiconductor device having multiple channels.

2. Description of the Related Art

A processing system can access a multi channel memory device being independently operated through different channels in one package.

A multi channel memory device that can be constituted by a volatile memory such as a DRAM can be packaged in one package after being embodied using one die (or chip). A multi channel semiconductor device can be connected to a corresponding processor to independently perform a data read operation or a data write operation through respective channels In the case where a multi channel semiconductor device is embodied by a mono die, density may be degraded on a wafer or edge die availability may be degraded due to a comparatively large size of two or more channels.

SUMMARY

Embodiments of the inventive concept provide an operation method of a semiconductor device. The semiconductor device may include separate first and second dies in a package. The semiconductor device may receive first types of signals through first and second respective channels independent of each other and corresponding to the first and second respective dies. The operation method may include a step in which when information for controlling internal operations of the first and second dies is first applied to the first die, the first die performs the internal operation and also transmits the information to the second die through an internal interface connecting the first die and the second die; and a step in which when the information is transferred to the second die, the second die performs the internal operation. When the information is first applied to the second die, the second die also transmits the information to the first die through the internal interface.

In certain embodiments, the first and second dies are each packaged directly on a same, single package substrate.

In certain embodiments, the first and second dies are independently packaged on different package substrates.

In certain embodiments, the information is one of a reset signal for resetting operations of the first and second dies and a ZQ signal for ZQ calibration operations of the first and second dies.

In certain embodiments, the internal interface is one of a wired interface and a wireless interface for information interfacing between the first and second dies.

When the internal interface is a wired interface, it may include at least one of an interposer, a wire bonding and a printed circuit board. When the internal interface is a wireless interface, it may perform an optical communication.

In one embodiment, the first and second dies have the same storage capacity and physical size as each other.

The first and second separate dies may form a DDR DRAM performing the same data access operation as a 2 channel single die.

Embodiments of the inventive concept also provide a semiconductor device. The semiconductor device may include a package substrate, a first die on the package substrate, a second die on the package substrate, and an internal interface. The first die may have a first channel to function as a first chip. The second die may have a second channel different from the first channel to function as a second chip and including the same storage capacity and physical size as the first die. The internal interface may form a internal interface disposed between the first and second dies, and may be configured to transmit information for controlling internal operations of the first and second dies and first applied to a first recipient die of the first and second dies to the other die.

In one embodiment, the first and second dies are each packaged directly on the package substrate.

In one embodiment, the information is one of a reset signal for resetting operations of the first and second dies and a ZQ signal for ZQ calibration operations of the first and second dies.

In one embodiment, the first die is horizontally adjacent the second die.

In one embodiment, the semiconductor device is configured such that information having a first type is transmitted to the first die through the first channel without passing between the first die and the second die, and is transmitted to the second die through the second channel without passing between the first die and the second die, and the information for controlling internal operations of the first and second dies is a different type of information from the first type.

Embodiments of the inventive concept also provide a semiconductor device including: a package substrate, a first chip mounted on the substrate, a second chip mounted on the substrate to be horizontally adjacent the first chip, a first channel connected to the first chip for receiving a first type of information at the first chip, a second separate channel connected to the second chip for receiving the first type of information at the second chip, and an internal interface connected between the first chip and the second chip, the internal interface configured to transmit a second type of information different from the first type between the first chip and the second chip. The second type of information is used by both the first chip and the second chip.

In one embodiment, the first type of information is read/write access information, the second type of information is operation control information applied to both the first chip and the second chip to control operation of the respective chips.

In one embodiment, the second type of information relates to a reset command or a ZQ command.

In one embodiment, the semiconductor device is configured such that information having the first type is transmitted to the first chip through the first channel without passing between the first chip and the second chip, and is transmitted to the second chip through the second channel without passing between the first chip and the second chip.

In one embodiment, the second type of information is operation control information for the first and second chips.

In one embodiment, the semiconductor device additionally includes a control circuit on at least one of the first and second chips, and configured to receive information of the second type.

BRIEF DESCRIPTION OF THE FIGURES

Various embodiments of the inventive concept will be described below in more detail with reference to the accompanying drawings. The embodiments described herein may, however, be embodied in different forms and should not be constructed as limited to the embodiments set forth herein. Like numbers refer to like elements throughout.

DETAILED DESCRIPTION

Figure 1:
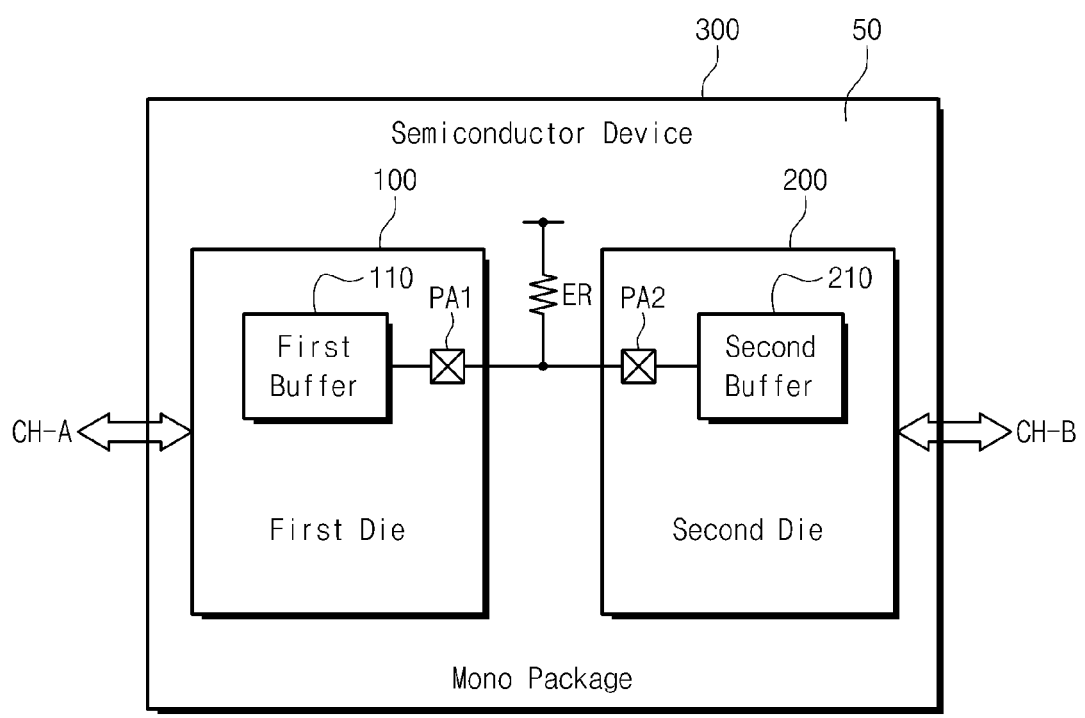
FIG. 1 is a block diagram illustrating a constitution of a semiconductor device in accordance with exemplary embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. In the drawings, the size and relative sizes of layers and regions may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another, for example as a naming convention. For example, a first chip could be termed a second chip, and, similarly, a second chip could be termed a first chip without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a constitution of a semiconductor device in accordance with exemplary aspects of the inventive concept.

Referring to FIG. 1, a semiconductor device 300 includes a first die 100 and a second die 200. The first and second dies 100 and 200 can be packaged together in a mono package. As described herein, a mono package refers to a semiconductor device including a plurality of dies on a single package substrate (e.g., package substrate 50). At least two of the dies may be at the same height above the package substrate. For example, a mono package may include a plurality of chips, each chip disposed at a first level above the package substrate, so that the chips are horizontally adjacent to each other. A semiconductor device may be in the form of a mono package. The term "semiconductor device," however, may also be used to generally refer to other items, such as a package-on-package device, or simply a semiconductor chip or a package with a single chip.

In one embodiment, the first die 100 is connected to a first channel and functions as a first chip and the second die 200 is connected to a second channel independent of the first channel and functions as a second chip. In one embodiment, the second die 200 has the same storage capacity and die size for storing data as the first die 100.

An internal interface for transmitting information for controlling an internal operation of the first and second dies 100 and 200 between each other is disposed between the first die 100 and the second die 200. The internal interface may include various circuitry such as, for example, first and second buffers 110 and 210 and first and second pads PA1 and PA2. The internal interface may also include a conductive line connecting between the first die 100 and second die 200. For example, the conductive line may extend along the package substrate (e.g., it may be formed in and/or on the package substrate 50).

In certain embodiments described herein, a die refers to an individual chip manufactured from a wafer. A plurality of dies of before being separated from a wafer may be manufactured at once through various semiconductor manufacturing processes for producing an individual chip. The various semiconductor manufacturing processes may include, for example, an oxidation process, a photolithography process, a thin film formation process, an etching process, and/or a CMP process. One die becomes one chip and two or more dies constitute two or more chips that may be used to form, for example, one multi channel semiconductor device.

The two dies of the multi channel semiconductor device may be formed of two chips, with one chip accessed for certain types of signals or types of accesses through one respective channel and the other chip accessed for the same types of signals or types of accesses through another respective channel. Some types of accesses that may be performed through the first or second channels include, for example, read and write access requests. As such, information having a first type (e.g., read/write access information such as a read/write command, address, and/or data) may be transmitted to the first chip through the first channel without passing between the first chip and the second chip, and may be transmitted to the second chip through the second channel without passing between the first chip and the second chip.

In one embodiment, the first channel CH-A is an exclusive channel for the first die 100 and the second channel CH-B is an exclusive channel for the second die 200.

The first and second channels CH-A and CH-B may be connected to a memory controller that communicates with a host such as a microprocessor. When a data read request or a data write request is received from the host, the memory controller applies a read command or a write command to the semiconductor device 300 through the first and second channels CH-A and CH-B.

For example, the first channel CH-A and second channel CH-B may be independent of each other, such as physically separate from each other. As such, it may be possible to send/receive commands, addresses, and/or data between a controller and the first chip 100 at the same time as sending/receiving commands, addresses, and/or data between the controller and the second chip 200.

In one embodiment, the first die 100 receives a command, an address and data through the first channel CH-A. The first die 100 outputs data read from a memory cell through the first channel CH-A.

Similarly, the second die 200 may receive a command, an address and data through the second channel CH-B. The second die 200 outputs data read from a memory cell through the second channel CH-B.

The first and second dies 100 and 200 may be manufactured on the same wafer or different wafers prior to being included in the semiconductor device 300.

In one embodiment, although the semiconductor device 300 has two dies, the semiconductor device 300 operates as a 2-channel semiconductor memory device being formed by one die. In this case, certain control signals, such as a reset signal for resetting an operation of the first and second dies 100 and 200 and a ZQ signal for controlling a ZQ calibration operation of the first and second dies 100 and 200 with respect to an external resistor ER external to the dies may be applied to any one of the first and second dies 100 and 200 (referred to as a first recipient, or direct recipient die), and is then applied through the receiver die to the other of the first and second dies 100 and 200 (referred to as second recipient, or indirect recipient die). For example, a ZQ signal received by the first die 100 may be used to control a ZQ calibration operation of the first die 100, and additionally may be transmitted to the second die 200, for example, through an internal interface connecting between the first die 100 and second die 200. In an alternative embodiment, a ZQ signal received by the first die 100 may be used to control a ZQ calibration operation of the first die 100 with respect to an external resistor (ER), for example, by being input to a first buffer 110, and by using the output from the buffer for the calibration operation in the first die 100. The same output from the first buffer 110 may then be transmitted to the second die 200, for example, via an internal interface, and that output may be used for a calibration operation in the second die 200.

In case of installing the first and second dies 100 and 200 having the same storage capacity and size, and channels independent of each other in a mono package, in one embodiment, when information such as a reset signal or a ZQ signal for controlling an internal operation of the first and second dies 100 and 200 (generally referred to as operation control information, which may relate to a reset command or ZQ command, for example) is applied to the first die 100, the first die 100 transmits the information to the second die 200 through an internal interface. For example, information being applied to the first buffer 110 is transmitted to the second pad PA2 through the first pad PA1. Since the first pad PA1 and the second pad PA2 are connected to each other over wires or wirelessly, the information transmitted to the second pad PA2 is provided to the second buffer 210 of the second die 200. Thus, in the case that the information is a reset signal, the second die 200 is reset in response to the information transmitted from the first die 100. In the case that the information is a ZQ signal, the second die 200 performs a ZQ calibration operation with respect to an external resistor (ER) in response to the information transmitted from the first die 100.

When information like the reset signal or the ZQ signal is applied to the second die 200, the second die 200 transmits the information to the first die 100 through the internal interface. For example, information being applied to the second buffer 210 is transmitted to the first pad PA1 via the second pad PA2. Since the first pad PA1 and the second pad PA2 are connected to each other over wires or wirelessly, the information transmitted to the first pad PA1 is provided to the first buffer 110 of the first die 100. Thus, in the case that the information is a reset signal, the first die 100 is reset in response to the information transmitted from the second die 200. In the case that the information is a ZQ signal, the first die 100 performs a ZQ calibration operation in response to the information transmitted from the second die 200.

The internal interface may include an interconnection connected between the first and second pads PA1 and PA2 over wires. For example, in one embodiment, the internal interface includes a functional circuit block for transmitting information between a first and second die via a wired or wireless interconnection. In one embodiment, the interconnection can be formed through at least one of a through via and a wire bonding in a packaging stage, for example, after dies are cut from a wafer.

However, the interconnection may be formed using other interface circuits and other configurations as well. This interconnection part may be thought of as a internal interface, that is not dedicated to one of the chips 100 or 200, as it is configured to transfer signals to both of the chips and between the chips from one to another. Thus, this channel may be referred to herein as a non-dedicated channel or common channel. It may be used to transfer different types of signals from the types of signals passed through the first and second channels CH-A and CH-B described above.

For example, the interconnection may include the pads on the first and second dies 100 and 200, conductive lines connected to the pads (e.g., wire bonded wires, or through substrate vias), pads on the package substrate 50 connected to the conductive lines, and internal wiring extending along (e.g., in and/or on) the package substrate 50. Alternatively, the first die 100 and second die 200 may each be flip-chip bonded to the package substrate 50, which includes conductive lines therein connecting between first pads that connect to terminals of the first die 100 and second pads that connect to terminals of the second die 200.

The information may be applied to one of the first and second dies 100 and 200 through the first and second channels CH-A and CH-B or separate channels.

In the case that a memory capacity of the first die 100 is 4 Gbit, since a memory capacity of the second die 200 is also 4 Gbit, a 2-channel semiconductor device has a memory capacity of 8 Gbit.

If embodying the 2-channel semiconductor device having a memory capacity of 8 Gbit by two dies, degradation of density on a wafer may be prevented or edge die availability may be improved as compared with a case of embodying the 2-channel semiconductor device having a memory capacity of 8 Gbit by one die. Consequently, yield is improved and thereby a manufacturing cost burden may become lighter.

In FIG. 1, the first and second dies 100 and 200 are packaged in a mono package but without being limited thereto. For example, 4 or 8 chips may be included in the mono package to constitute a 4 or 8 channel semiconductor device.

The first and second dies 100 and 200 may be, for example, a DDR4 DRAM having a plurality of memory cells, each including one access transistor and one capacitor.

Figure 2:
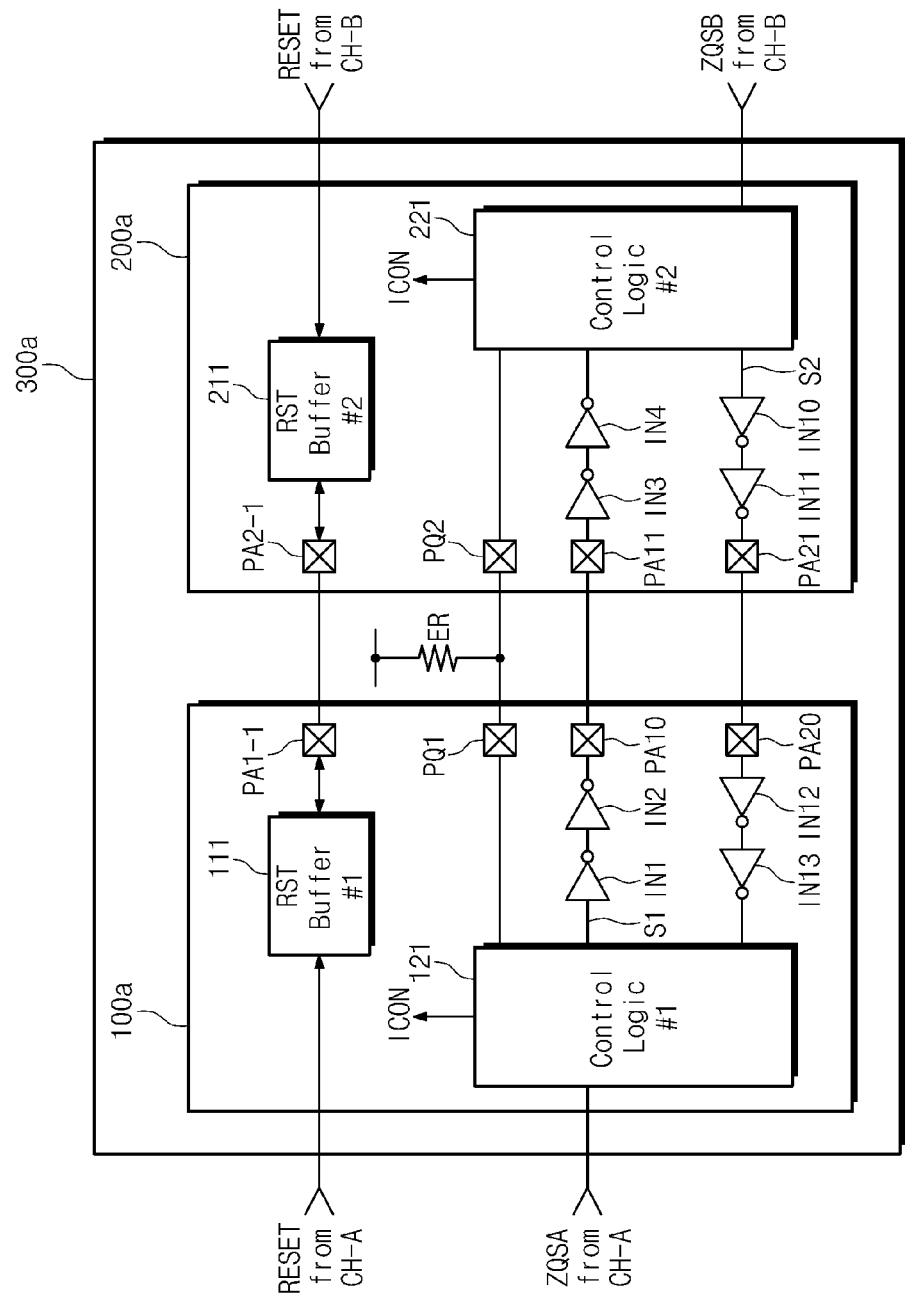
FIG. 2 is a block diagram illustrating another constitution of a semiconductor device in accordance with certain embodiments of the inventive concept.

FIG. 2 is a block diagram illustrating another constitution of a semiconductor device in accordance with certain aspects of the inventive concept.

Referring to FIG. 2, a semiconductor device 300*a* includes a first die 100*a* and a second die 200*a*. The first and second dies 100*a* and 200*a* can be packaged together in a mono package or be independently packaged. For example, they may share a single package substrate on which they are both directly mounted, or they may be formed on separate package substrates. In either case, the first and second dies 100*a* and 200*a* may be disposed horizontally adjacent to each other.

In certain embodiments, depending on whether a single package substrate or separate package substrates are used, the first and second dies 100*a* and 200*a* may be packaged in different configurations, such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

The first die 100a is connected to a first channel and functions as a first chip and the second die 200a is connected to a second channel independent of the first channel and functions as a second chip. In one embodiment, the second die 200a has the same storage capacity and die size for storing data as the first die 100a.

An internal interface for transmitting information for controlling an internal operation of the first and second dies 100a and 200a between each other is disposed between the first die 100a and the second die 200a. The internal interface, also referred to as an interface circuit, may include first and second buffers 111 and 211 and first and second pads PA1-1 and PA2-1. The internal interface may include inverters IN1, IN2, IN3, IN4, IN10, IN11, IN12 and IN13 that function as a driver, a plurality of pads PA10, PA11, PA20 and PA21 and first and second control logics 121 and 122, also referred to as a control circuit.

For example, a reset signal RESET being applied to the first buffer 111 may be provided to the second buffer 211 via the first and second pads PA1-1 and PA2-1. Thus, the first die 100a is reset, and the second die 200a may also be reset in response to the reset signal transmitted from the first die 100a. A reset signal RESET being applied to the second buffer 211 may be provided to the first buffer 111 via the first and second pads PA1-1 and PA2-1. Thus, the second die 200a is reset, and the first die 100a may also be reset in response to the reset signal RESET transmitted from the second die 200a.

If a ZQ signal (or ZQ command) is applied to the first die 100a as a signal ZQSA, it may be provided to the second control logic 221 in the second die 200a as a signal 51 via the inverters IN1 and IN2, the pads PA10 and PA11 and the inverts IN3 and IN4. Thus, a ZQ calibration operation of the first die 100a is performed with respect to the external resistor (ER), and the second die 200a may also perform a ZQ calibration operation with respect to the external resistor (ER) in response to the ZQ signal transmitted from the first die 100a. As a result of performing the ZQ calibration operation, an internal control signal ICON may be generated to be used to control on-resistance values and on-termination values of an output driver in the second die 200a.

If a ZQ signal (or ZQ command) is applied to the second die 200a as a signal ZQSB, it may be provided to the first control logic 121 in the first die 100a as a signal S2 via the inverters IN10 and IN11, the pads PA21 and PA20 and the inverts IN12 and IN13. Thus, a ZQ calibration operation of the second die 200a is performed with respect to the external resistor (ER), and the first die 100a may also perform a ZQ calibration operation with respect to the external resistor (ER) in response to the ZQ signal transmitted from the second die 200a. As a result of performing the ZQ calibration operation, an internal control signal ICON may be generated to be used to control on-resistance values and on-termination values of an output driver in the first die 100a.

The ZQ calibration means a process of generating an impedance code being changed, for example, according to a change of a PVT (process, voltage, temperature) condition. A termination resistance value may be controlled using a code generated by performing the ZQ calibration. A pad connected to an external resistor which becomes a standard of calibration is called a ZQ pad and originating from that, the term "ZQ calibration" is frequently used in this field.

As an operation speed of an electrical appliance increases, a swing width of a signal being interfaced between semiconductor devices is gradually reduced. The reason is to minimize a delay time it takes to transmit a signal. However, as a swing width of the signal is reduced, the effects on external noises are increased and a reflection of a signal caused by impedance mismatching becomes more severe. The impedance mismatching occurs due to changes of an external noise, a power supply voltage, an operation temperature and a manufacturing process. If the impedance mismatching occurs, it is difficult to transmit data in high speed and output data being outputted from a data output stage of a semiconductor device may be distorted.

Thus, in the case that a semiconductor device receives a distorted output signal, problems of a setup/hold fail or an input level miss judgment may arise.

Even in the case where a PVT condition is changed, if an impedance mismatching is done according to the performance of a ZQ calibration, various problems caused by mismatching may be overcome.

Figure 3:
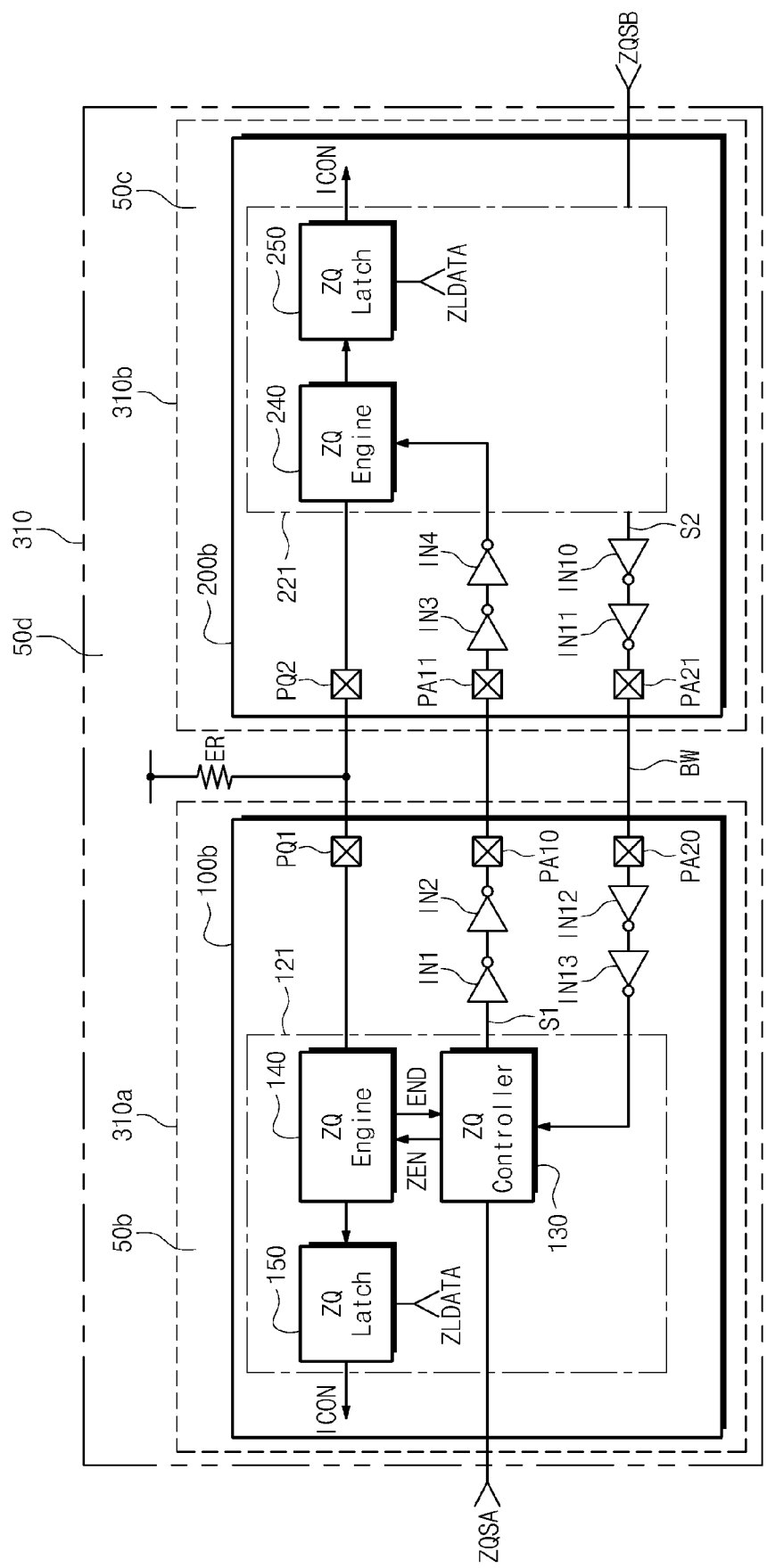
FIG. 3 is a drawing illustrating a detailed embodiment of control logics in accordance with FIG. 2, according to one exemplary embodiment.

FIG. 3 is a drawing illustrating a detailed embodiment of control logics in accordance with FIG. 2, according to one exemplary embodiment.

Referring to FIG. 3, a first die 100b and a second die 200b may be embodied together in one package 310. The first die 100b and the second die 200b may be manufactured on the same wafer. The second die 200b may be disposed in mirror symmetry relative to the first die 100b in the one package 310.

The first die 100b and the second die 200b may be embodied independently of each other in different packages 310a and 310b, for example, that together are part of one package. For example, the first die 100b may be mounted on a first package substrate 50b to form a first package, the second die 200b may be mounted on a second package substrate 50c to form a second package, and both the first package and second package may be mounted on a third package substrate 50d, for example to be horizontally adjacent to each other, to form a package-on-package device, referred to as a third package.

In one embodiment, the first package substrate 50b and second package substrate 50c may each function as an interposer, and thus may be part of an internal interface configured to transmit signals between the first and second dies 100a and 100b (e.g., via pads PQ1 and PQ2, PA10 and PA11, and PA20 and PA21. In some embodiments, however, signals passing, for example between corresponding pads of respective dies may be transmitted through wires, such as wire-bonded wires connected between the respective pads.

The first die 100b includes a ZQ controller 130, a ZQ engine 140 and a ZQ latch 150 to perform a ZQ calibration operation.

The second die 200b includes a ZQ engine 240 and a ZQ latch 250 to perform a ZQ calibration operation. Although the ZQ controller 130 is not installed in the second die 200b, in the case that the ZQ controller 130 is not installed in the first die 100b, a ZQ controller may be installed in the second die 200b. However, the inventive concept is not limited thereto and a ZQ controller, also referred to as a control circuit, may be installed in both the first die 100b and the second die 200b.

If a ZQ signal ZQSA is applied to the ZQ controller 130 of the first die 100b, the ZQ controller 130 applies a ZQ enable signal ZEN to the ZQ engine 140. The ZQ engine 140 performs a ZQ calibration with respect to a ZQ resistor (e.g., external resistor (ER)) connected to a ZQ pad PQ1 to apply a ZQ calibration code to the ZQ latch 150. The ZQ latch 150 latches the ZQ calibration code in an internal latch device in response to a ZQ latch signal ZLDATA.

If a ZQ calibration operation of the first die 100b is completed, the ZQ controller 130 receives a calibration ending signal END from the ZQ engine 140.

Also, the ZQ controller 130 provides a ZQ signal ZQSA to the inverter IN1. Accordingly, the ZQ signal ZQSA indicating the beginning of a ZQ calibration operation is provided to the ZQ engine 240 of the second die 200b sequentially via the inverter IN2, the pads PA10 and PA11 and the inverters IN3 and IN4. This may be done after receiving the END signal, or prior to receiving the END signal.

The ZQ engine 240 performs a ZQ calibration with respect to a ZQ resistor ER connected to a ZQ pad PQ2 to apply a ZQ calibration code of the second die 200b to the ZQ latch 250. The ZQ latch 250 latches the ZQ calibration code in an internal latch device in response to a ZQ latch signal ZLDATA.

Thus, a ZQ calibration operation of the first die 100b is performed, and the second die 200b may also perform a ZQ calibration operation in response to the ZQ signal transmitted from the first die 100b. A result of the ZQ calibration latched in the ZQ latch 250 may be used to control on-resistance values and on-termination values of an output driver in the second die 200b.

If a ZQ signal ZQSB is applied to the second die 200b, the ZQ controller 130 of the first die 100b can receive the ZQ signal ZQSB through the inverters IN10 and IN11, the pads PA21 and PA20 and the inverters IN12 and IN13. Even in this case, the ZQ controller 130 can perform a ZQ control operation the same as that described above. An interconnection connecting between the pads PA21 and PA20 may be by a wire, such as a bonding wire BW. Alternatively, the interconnection may be an optical transmission channel or a wireless transmission channel besides the bonding wire, for example, based on known technologies for transmitting signals to and from semiconductor chips.

Figure 4:
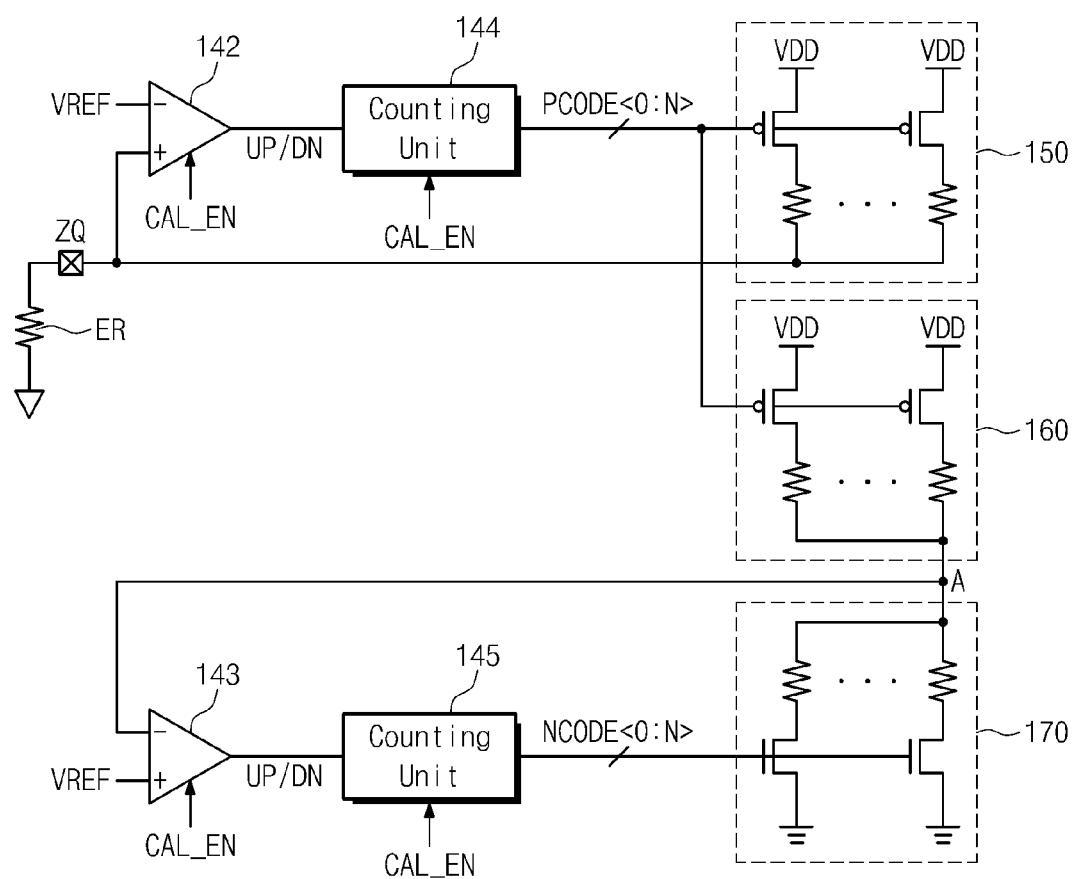
FIG. 4 is a drawing illustrating a detailed embodiment of a ZQ engine in accordance with FIG. 3, according to one exemplary embodiment.

FIG. 4 is a drawing illustrating a detailed embodiment of a ZQ engine in accordance with FIG. 3, according to one exemplary embodiment.

Referring to FIG. 4, the ZQ engine may include a pull-up reference resistance unit 150, a dummy reference resistance unit 160, a pull-down reference resistance unit 170, a comparison unit 142 and 143, and a counting unit 144 and 145.

The comparison unit 142 compares a voltage of a pad ZQ which is a first calibration node with a reference voltage VREF (generally, set to VDD/2). An up/down signal according to the comparison result is generated at an output terminal of the comparison unit 142. The voltage of the pad ZQ is a voltage generated by a voltage division of an external resistor ER (for example, 240Ω) connected to a calibration pad ZQ PAD and the pull-up reference resistance unit 150.

The counting unit 144 generates a pull-up code (PCODE<0:N>) in response to the up/down signal. Parallel resistors (each resistance value is designed to conform Binary Weight) in the pull-up reference resistance unit 150 are turned on/off by the pull-up code PCODE and thereby a resistance value of the pull-up reference resistance unit 150 is controlled. The controlled resistance value of the pull-up reference resistance unit 150 affects a voltage of the pad ZQ which is the first calibration node and thereby the comparison operation and the counting operation are repeated.

Consequently, a calibration operation of pull-up side is repeated until a resistance value of the pull-up reference resistance unit 150 becomes equal to a resistance value of the external resistor ER.

The pull-up code (PCODE<0:N>) being generated by the pull-up calibration operation is input to the dummy resistance unit 160 to determine a total resistance value of the dummy resistance unit 160.

If a calibration operation of the pull-up side is completed, a calibration operation of the pull-down side starts. In the same manner as or similar manner to the calibration operation of the pull-up side, the calibration operation of the pull-down side is performed with respect to the pull-down reference resistance unit 170 using the comparison unit 143 and the counting unit 145. The pull-down calibration operation is performed so that a voltage of a second calibration node A becomes the same as the reference voltage VREF, that is, a total resistance value of the pull-down reference resistance unit 170 becomes the same as a resistance value of the dummy resistance unit 160.

The code generated by the calibration operation (e.g., a ZQ calibration code) may be used to control an on-resistance value or on-die termination values of the output driver. For example, the code may be applied to the ZQ latches described in FIG. 3.

Figure 5:
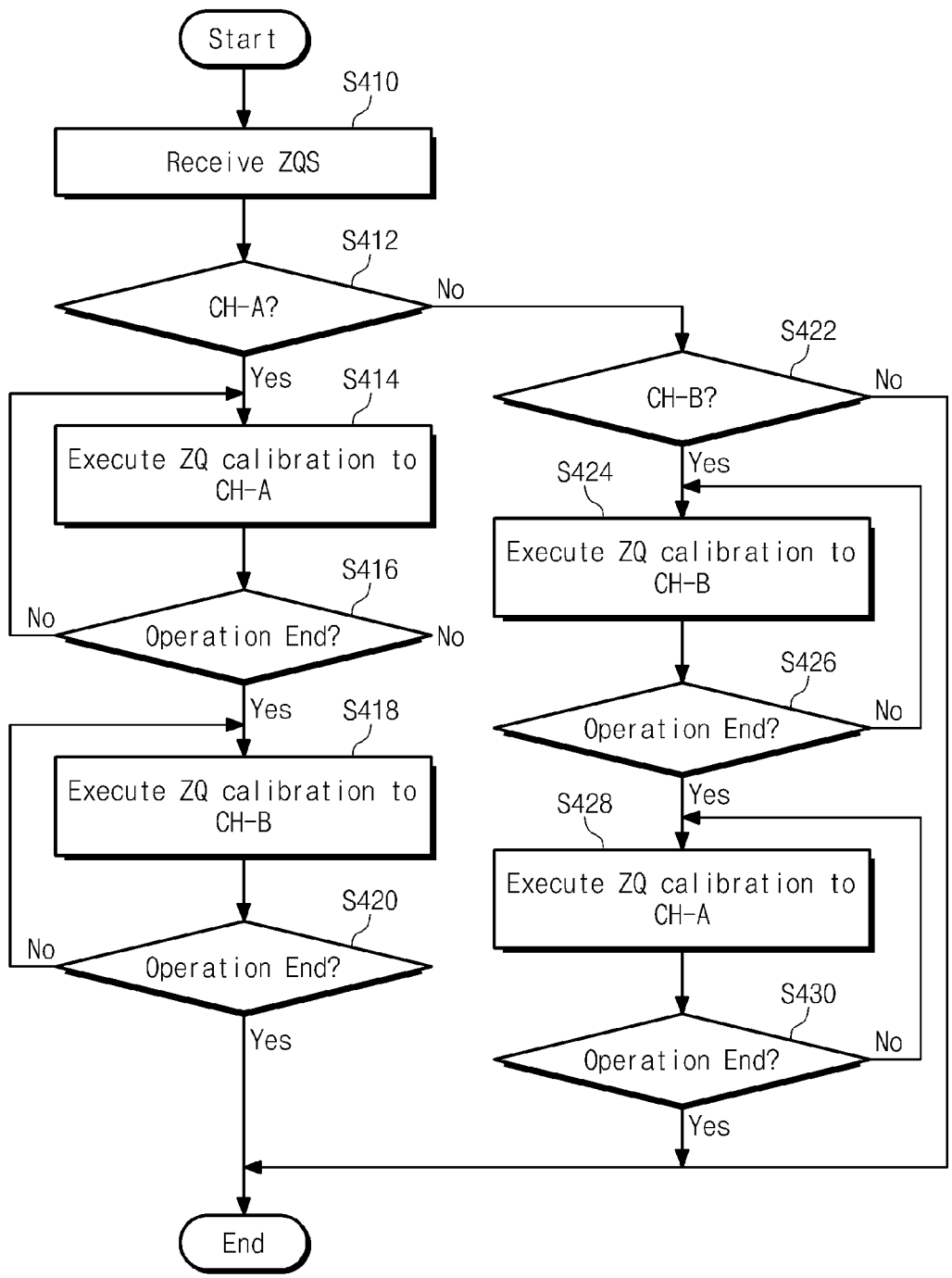
FIG. 5 is a flow chart of a ZQ calibration control in accordance with FIG. 3, according to one exemplary embodiment.

FIG. 5 is a flow chart of a ZQ calibration control in accordance with FIG. 3, according to one exemplary embodiment.

If in a step S410, a signal, that is, ZQS directing a ZQ calibration operation to start is received, in a step S412, it is checked whether the ZQS is received from the first die 100b. The step S412 may be performed by the ZQ controller 130 of FIG. 3.

In the case that the ZQS is received from the first die 100b, in a step S414, a ZQ calibration operation with respect to the first die 100b is performed before a ZQ calibration operation with respect to the second die 200b.

In the case that the ZQS is not received from the first die 100b, in a step S422, it is checked whether the ZQS is received from the second die 200b. In the case that the ZQS is received from the second die 200b, in a step S424, a ZQ calibration operation with respect to the second die 200b is performed before a ZQ calibration operation with respect to the first die 100b.

In a step S416, it is checked whether a ZQ calibration operation with respect to the first die 100b is completed. In the case that a ZQ calibration operation is completed, in a step S418, a ZQ calibration operation with respect to the second die 200b begins. As the ZQS received through the first die 100b is transmitted to the second die 200b through an interface, the ZQ calibration operation with respect to the second die 200b is performed like the operation method described in FIG. 3.

In a step S420, it is checked whether the ZQ calibration operation with respect to the second die 200b is completed. In the case that the ZQ calibration operation with respect to the second die 200b is not completed, the procedure returns to the step S418 and in the case that the ZQ calibration operation with respect to the second die 200b is completed, the ZQ calibration operation is over.

In a step S426, it is checked whether the ZQ calibration operation with respect to the second die 200b is completed. In the case that the ZQ calibration operation with respect to the second die 200b is completed, in a step S428, a ZQ calibration operation with respect to the first die 100b begins. As the ZQS received through the second die 200b is transmitted to the first die 100b through an interface, the ZQ calibration operation with respect to the first die 100b is performed.

In a step S430, it is checked whether the ZQ calibration operation with respect to the first die 100b is completed. In the case that the ZQ calibration operation with respect to the first die 100b is not completed, the procedure returns to the step S428 and in the case that the ZQ calibration operation with respect to the first die 100b is completed, the ZQ calibration operation is over.

In FIG. 5, although it is described that in the case that ZQS is received to the first die 100b, a ZQ calibration operation with respect to the first die 100b is performed first, a ZQ calibration operation with respect to the second die 200b may be performed first.

Although it is described that in the case that ZQS is received to the second die 200b, a ZQ calibration operation with respect to the second die 200b is performed first, a ZQ calibration operation with respect to the first die 100b may be performed first.

In case of a DDR DRAM, a ZQ command is used to perform an initial calibration during a power up initial sequence. The ZQ command may be provided, for example, after a reset signal is applied.

Figure 6:
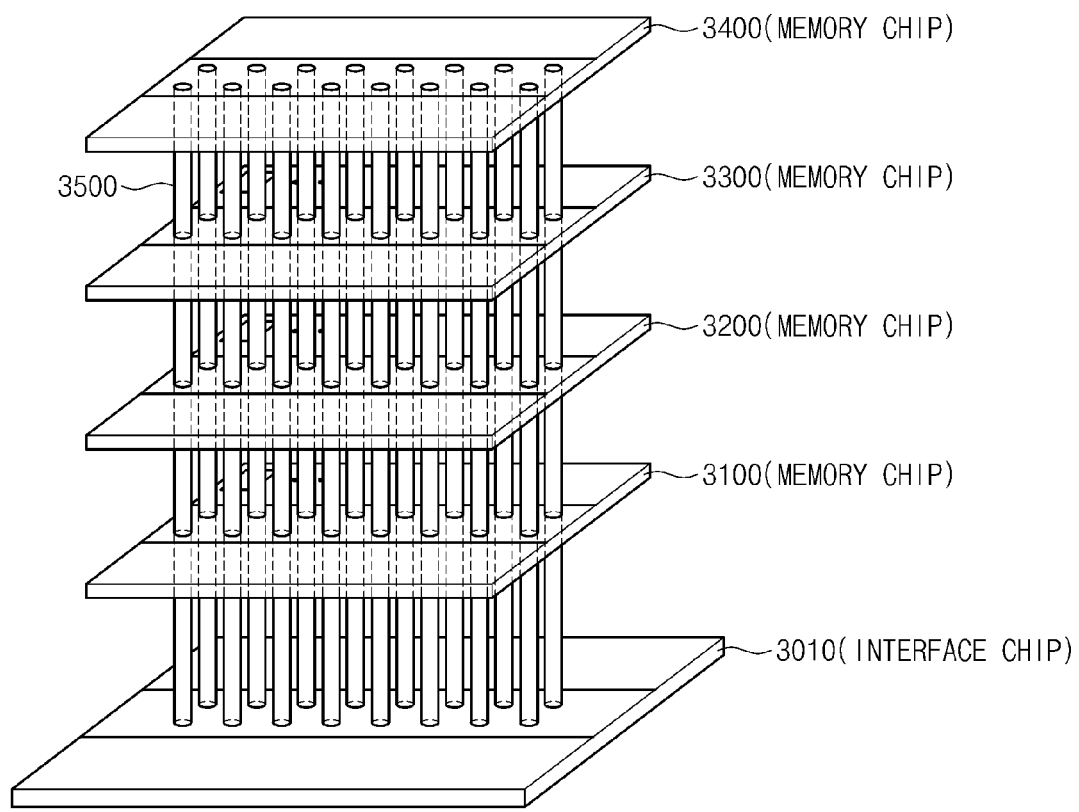
FIG. 6 is a drawing illustrating an application example of the inventive concept applied to a memory system being stacked through a TSV (through silicon via), according to one exemplary embodiment.

FIG. 6 is a drawing illustrating an application example of the inventive concept applied to a memory system being stacked through a TSV (through silicon via).

Referring to FIG. 6, an interface chip 3010 is located on the lowermost layer and memory chips 3100, 3200, 3300 and 3400 are located on the interface chip 3010. Each of the memory chips 3100, 3200, 3300 and 3400 may be constituted by a plurality of dies like FIG. 1. The chips are connected to one another through a micro bump (μ Bump) and signals being applied to the chips may be provided through a TSV (through silicon via). For instance, the number of stacked chips may be two or more.

In FIG. 6, each of the memory chips 3100, 3200, 3300 and 3400 may be embodied by a multi channel semiconductor device made of two or more dies. In the case that information such as a ZQ signal or a reset signal is applied through one die, since the other die receives an operation control signal in common through an internal interface, it is controlled together with the die to which the information is applied. In case of embodying a semiconductor device by two or more dies, manufacturing yield of the semiconductor device is improved compared with a 2 channel semiconductor device being formed in one die.

Figure 7:
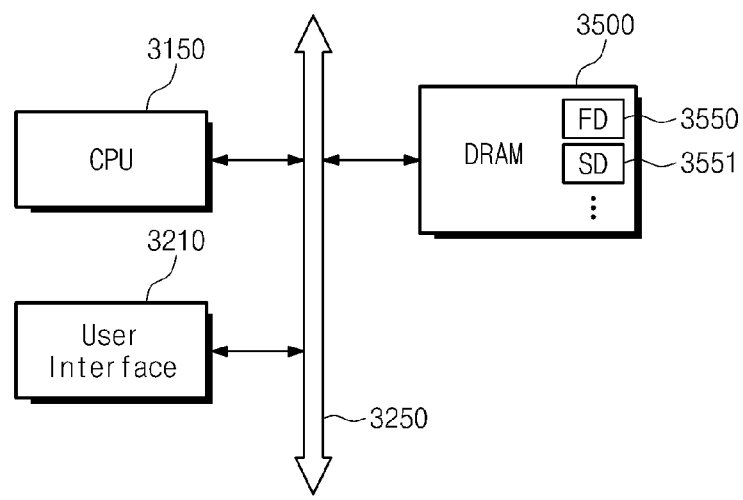
FIG. 7 is a drawing illustrating an application example of the inventive concept applied to an electronic system, according to one exemplary embodiment.

FIG. 7 is a drawing illustrating an application example of the inventive concept applied to an electronic system.

Referring to FIG. 7, a DRAM 3500, a central processing unit (CPU) 3150 and a user interface 3210 are connected to one another through a system bus 3250.

In the case that an electronic system is a portable electronic device, a separate interface may be connected to an external communication device. The communication device may be, for example, a DVD player, a computer, a set top box (STB), a game machine, a digital camcorder, etc.

The DRAM 3500 may be formed by packaging two or more dies 3550 and 3551 in one package, for example in one of the configurations described above.

In one embodiment, if information such as a ZQ signal or a reset signal is applied through one die in the DRAM 3500, the other die receives an operation control signal in common through an internal interface. Thus, the other die is controlled together with the die to which information is applied. In case of embodying a multi channel semiconductor device by two or more dies, manufacturing yield of the semiconductor device is improved compared with a 2 channel semiconductor device being formed in one die.

The bus 3250 may further adopt a flash memory in FIG. 7. However, the inventive concept is not limited thereto and various types of nonvolatile storages may be used.

The nonvolatile storage may store data information having various types of data such as a text, a graphic, a software code, etc.

Figure 8:
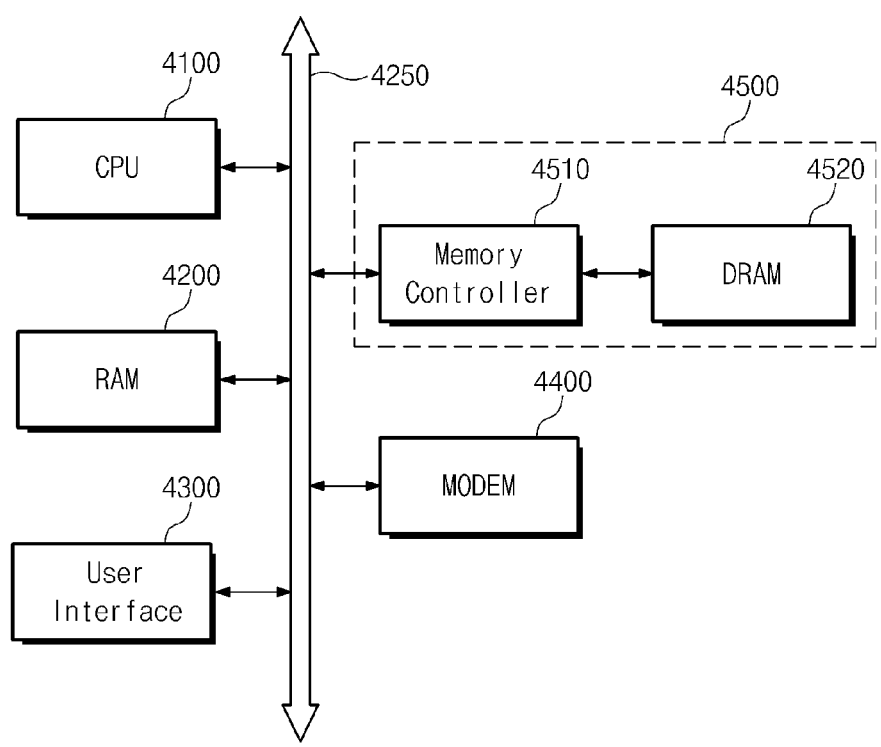
FIG. 8 is a block diagram illustrating an application example of the inventive concept applied to a computing device, according to one exemplary embodiment.

FIG. 8 is a block diagram illustrating an application example of the inventive concept applied to a computing device.

Referring to FIG. 8, a computing device may include a memory system 4500 including a DRAM 4520 and a memory controller 4510. The computing device may include an information processing device, a computer, etc. As an example, the computing device may include a modem 4400, a CPU 4100, a RAM 4200, a user interface 4300 that are electrically connected to a system bus 4250 besides the memory system 4500. The memory system 4500 may store data processed by the CPU 4100 or data input from the outside.

In the case that the DRAM 4520 is a DDR4 DRAM, the DRAM 4520 may be embodied by two or more dies in a mono package while including an internal interface like FIG. 2. Or the two or more dies may be packaged such as shown in FIG. 1 or 3-5. Thus, manufacturing yield is improved and thereby product cost of the computing device may be reduced.

The computing device may be applied, for example, to a solid state disk (SSD), a camera image processor and an application chipset. As an example, the memory system 4500 may be constituted by a SSD and in this case, the computing device can stably and reliably store large amounts of data in the memory system 4500.

Since the memory system 4500 may include the DRAM 4520 like FIG. 2 or the other embodiments described herein, computing device performance may be improved. The memory controller 4510 is a DRAM 4520 having a multi channel function and can channel-independently apply a command, an address, data, or a control signal.

The CPU 4100 functions as a host and controls an overall operation of the computing device.

A host interface between the processor 4100 and the memory controller 4510 includes various protocols to perform a data exchange between a host and the memory controller 4510. The memory controller 4510 can be configured to communicate with a host or an external device through at least one among various interface protocols such as a USB (universal serial bus) protocol, a MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, a SCSI (small computer small interface) protocol, an ESDI (enhanced small disk interface) protocol, and an IDE (integrated drive electronics) protocol.

The device like FIG. 8 can be provided as one of various constituent elements of electronic devices such as a computer, an ultra mobile PC (UMPC), a digital picture player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

Figure 9:
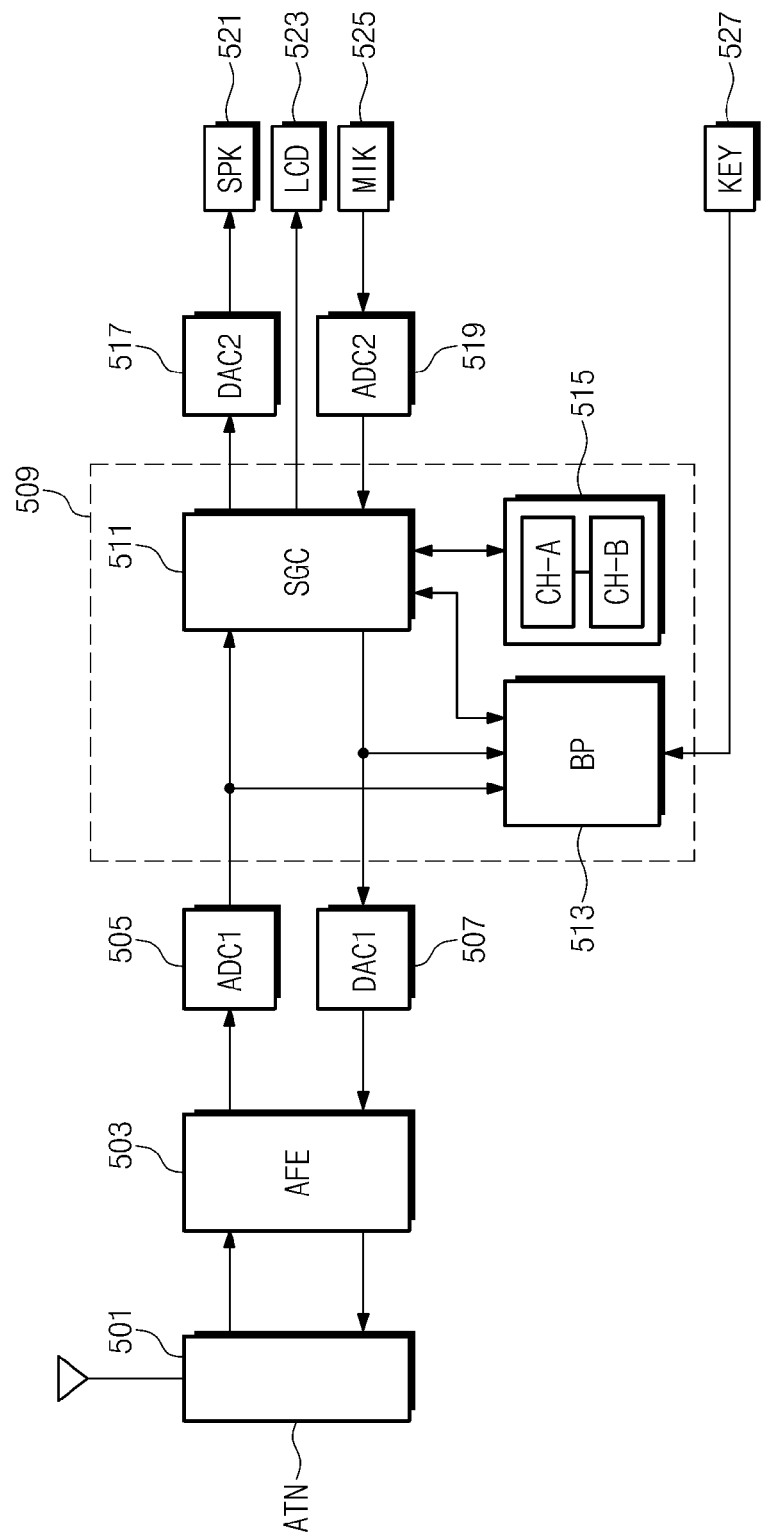
FIG. 9 is a drawing illustrating an application example of the inventive concept applied to a smart phone, according to one exemplary embodiment.

FIG. 9 is a drawing illustrating an application example of the inventive concept applied to a smart phone.

Referring to FIG. 9, a block diagram of a cellular phone such as a smart phone fitted with a multi channel DRAM 515 is illustrated. The smart phone may include an antenna ATN 501, an analog front end block AFE 503, analog-digital modulation circuits ADC1 505 and ADC2 519, digital-analog modulation circuits DAC1 507 and DAC2 517, a base band block BBD 509, a speaker SPK 521, a liquid crystal display LCD 523, a mike MIK 525, and an input key KEY 527.

The analog front end block AFE 503 is constituted by an antenna switch, a band pass filter, all sorts of amplifiers, a power amplifier, a PLL (phase-locked loop), a voltage controlled oscillator VCO, an orthogonal modulator and an orthogonal demodulator to execute an electric-wave transmission/reception. The base band block 509 may include a signal processing circuit SGC 511, a base band processor BP 513 and a multi channel DRAM 515.

An operation of the smart phone of FIG. 9 is described. In case of receiving an image including a voice and text information, an electric-wave input from an antenna is input to the analog-digital modulation circuit ADC1 505 through the analog front end block AFE 503 and converted into a digital signal. An output signal of the ADC1 505 is input to the signal processing circuit SGC 511 of the base band block 509 and then voice and image processes are performed on the output signal. A voice signal is transmitted from the digital-analog modulation circuit DAC2 517 to the speaker 521 and an image signal is transmitted to the liquid crystal display LCD 523.

In case of sending a voice signal, a signal input from the mike 525 is input to the signal processing circuit SGC 511 through the analog-digital modulation circuit ADC2 519 and then a voice process is performed. An output of the SGC 511 is transmitted from the digital-analog modulation circuit DAC1 507 to the antenna 501 through the analog front end block AFE 503. In case of sending text information, a signal input from the input key 527 is transmitted to the antenna 501 through sequentially the base band block 509, the digital-analog modulation circuit DAC1 507 and the analog front end block AFE 503.

In FIG. 9, the multi channel DRAM 515 may be embodied by a multi channel semiconductor memory device having first and second dies like FIG. 2 or the other embodiments described in connection with FIGS. 1-5. In this case, the multi channel DRAM 515 is accessed by the base band processor BP 513 through a first channel, and may also be accessed by an application processor not illustrated through a second channel. One memory device can be shared by two processors to be used.

Although the multi channel DRAM 515 is illustrated in FIG. 9, in another embodiment, a MRAM may be used instead of the DRAM 515.

A volatile semiconductor memory device such as a SRAM or a DRAM loses its stored data when its power is interrupted.

In contrast, a nonvolatile semiconductor memory device such as a MRAM retains its stored data even when its power is interrupted. Thus, to retain stored data even when its power is interrupted, a nonvolatile memory device may be used to store data.

In the case that a STT-MRAM (spin transfer torque magneto resistive random access memory) constitutes a multi channel memory device, an advantage of a MRAM may be added to an advantage of FIGS. 1-5.

A STT-MRAM cell may include a MTJ (magnetic tunnel junction) device and a select transistor. The MTJ device may include a fixed layer, a free layer and a tunnel layer disposed between the fixed layer and the free layer. A magnetization direction of the fixed layer is fixed and a magnetization direction of the free layer may be the same as that of the fixed layer or may be a reverse direction to the fixed layer depending on the conditions.

Figure 10:
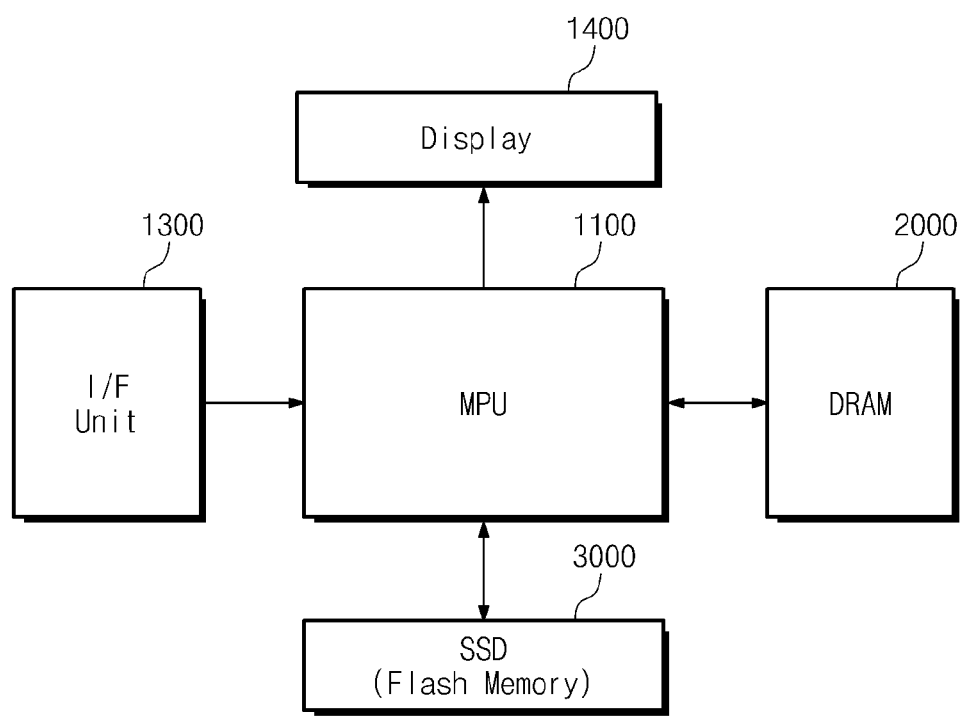
FIG. 10 is a block diagram illustrating an application example of the inventive concept applied to a mobile device, according to one exemplary embodiment.

FIG. 10 is a block diagram illustrating an application example of the inventive concept applied to a mobile device.

Referring to FIG. 10, a mobile device (e.g., a notebook, or a portable electronic device) may include a micro processing unit (MPU) 1100, a display 1400, an interface unit 1300, a DRAM 1200, and a solid state drive SSD 3000.

The micro processing unit (MPU) 1100, the DRAM 1200, and the solid state drive SSD 3000 may be manufactured or packaged in a single package. The DRAM 2000 and the flash memory (SSD) 3000 may be embedded in the mobile device.

The DRAM 2000 may be a memory embodied by two or more dies like FIG. 1.

In the case that the mobile device is a portable communication device, a modem and a transceiver performing functions of communication data transmission and reception and data modulation and demodulation may be connected to the interface unit 1300.

The MPU 1100 controls an overall operation of the mobile device according to the program previously set.

The DRAM 2000 is connected to the MPU 1100 through a system bus and may function as a buffer memory or a main memory of the MPU 1100.

The flash memory 3000 may be a NOR or NAND type flash memory.

The display 1400 is a liquid crystal having a backlight, a liquid crystal having a LED light source, or an OLED and may have a touch screen. The display 1400 functions as an output device displaying an image such as character, number, picture, etc. by color.

The mobile device is mainly described as a mobile communication device but if necessary, may function as a smart card by adding or subtracting constituent elements.

The mobile device may be connected to an external communication device through a separate interface. The external communication device may be a digital versatile disc (DVD), a player, a computer, a set top box (STB), a game machine, a digital camcorder, etc.

Although not illustrated in the drawing, the mobile device may be further provided with an application chipset, a camera image processor (CIS), a mobile DRAM, etc.

Although a flash memory is adopted in FIG. 10, various kinds of nonvolatile storages may be used.

The nonvolatile storage may store data information having various types of data such as a text, a graphic, a software code, etc.

Figure 11:
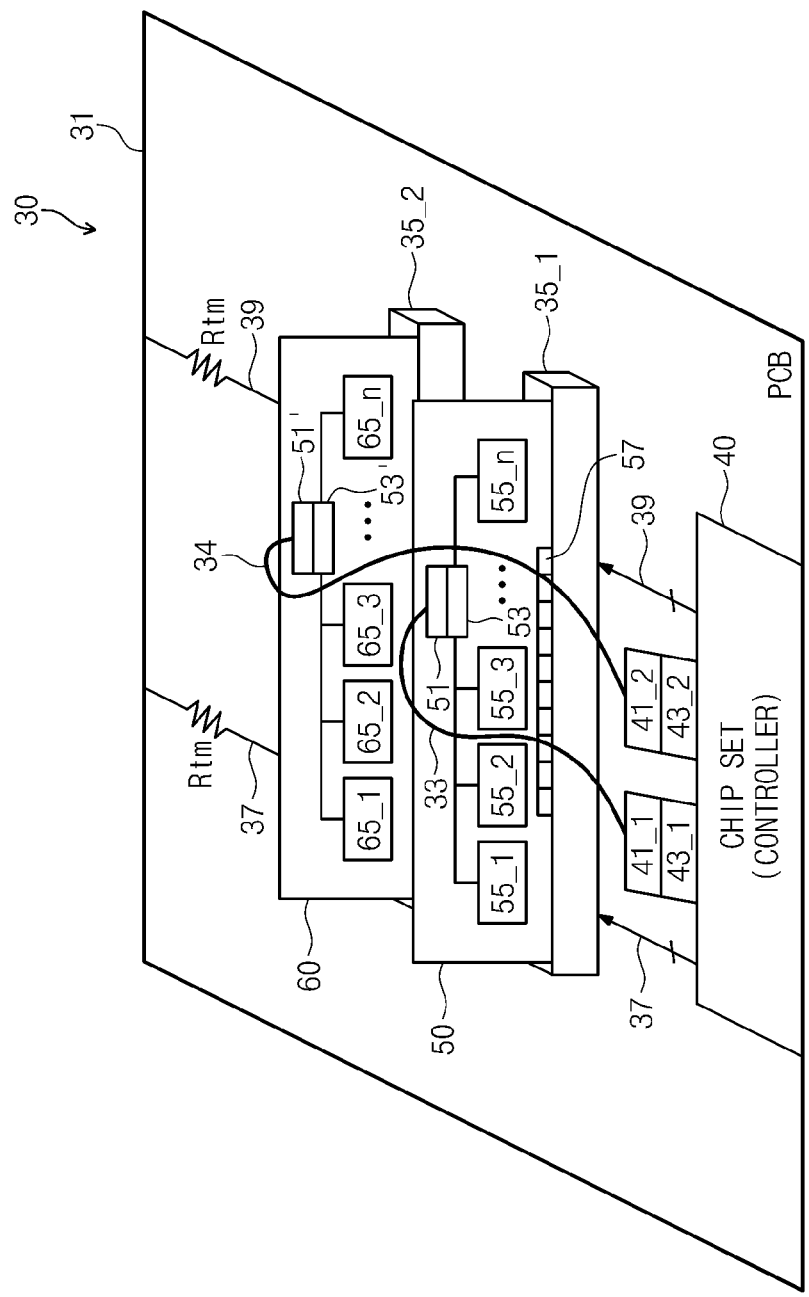
FIG. 11 is a block diagram illustrating an application example of the inventive concept applied to an optical I/O schema, according to one exemplary embodiment.

FIG. 11 is a block diagram illustrating an application example of the inventive concept applied to an optical I/O schema.

Referring to FIG. 11, the memory system 30 adopting a high speed optical I/O may include a chipset 40 as a controller and memory modules 50 and 60 loaded on a PCB 31. The memory modules 50 and 60 are inserted into slots 35_1 and 35_2 installed on the PCB 31 respectively. The memory module 50 may include a connector 57, a multi channel DRAMs 55_1~55_*n*, an optical I/O input unit 51 and an optical I/O output unit 53.

The optical I/O input unit 51 may include a photoelectric conversion device (e.g., photodiode) for converting an optical signal being applied into an electrical signal. Thus, an electrical signal being output from the photoelectric conversion device is received to the memory module 50. The optical I/O output unit 53 may include an electrophotic conversion device (e.g., a laser diode) for converting an electrical signal being output from the memory module 50 into an optical signal. If necessary, the optical I/O output unit 53 may further include an optical modulator for modulating a signal output from a light source.

An optical cable 33 performs an optical communication between the optical I/O input unit 51 and an optical transmission unit 41_1 of the chipset 40. The optical communication may have a bandwidth of more than several tens gigabits per second. The memory module 50 can receive signals or data being applied from signal lines 37 and 39 of the chipset 40 through the connector 57 and perform a high speed data communication with the chipset 40 through the optical cable 33. Resistors Rtm installed on the lines 37 and 39 are termination resistors.

Thus, the chipset 40 can independently perform a data read operation and a data write operation by channels through the multi channel DRAMs 55_1~55_n. In this case, if a reset signal or a ZQ signal is applied to one die, signals are applied to other dies through an internal interface. Thus, a manufacturing cost is reduced without performance degradation of the memory system 30.

In the case that the memory system of FIG. 11 is a SSD, the multi channel DRAMs 55_1~55_n may be used as a user data buffer.

Figure 12:
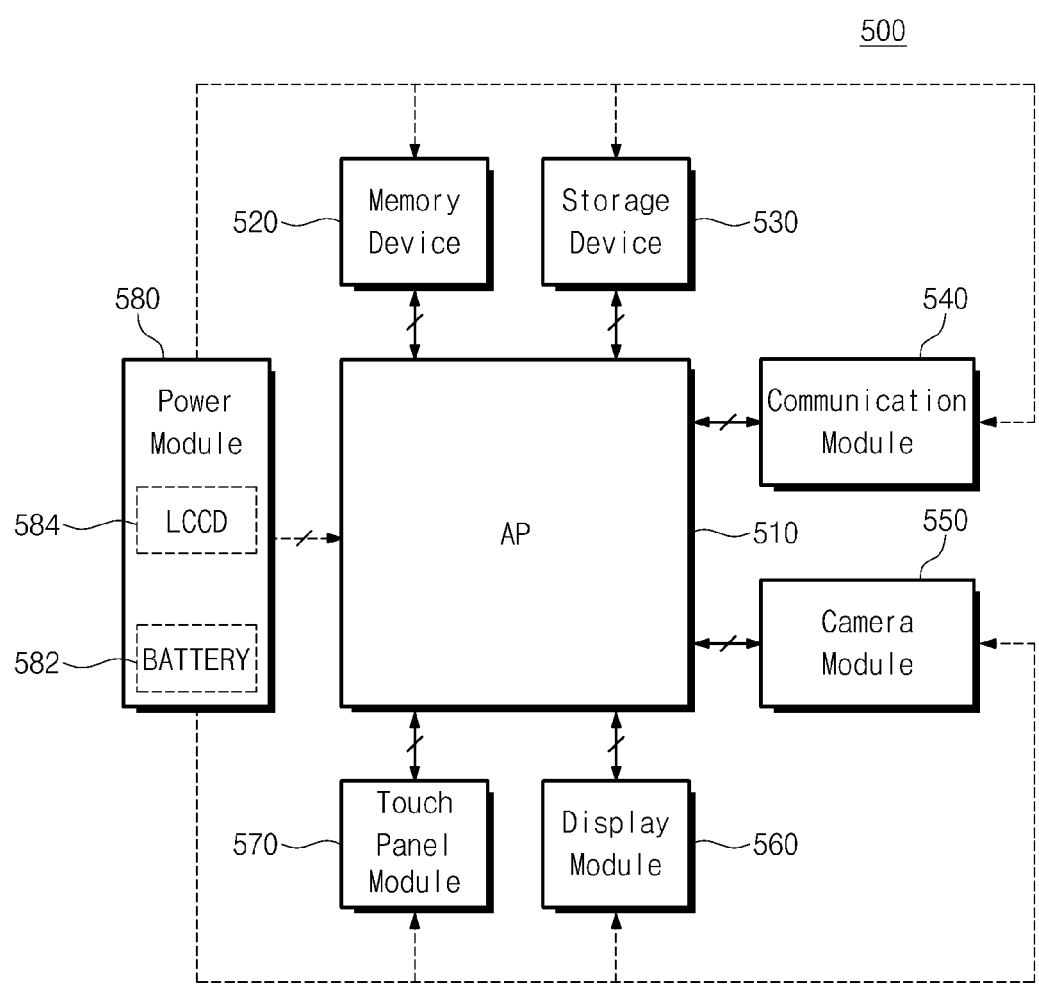
FIG. 12 is a block diagram illustrating an application example of the inventive concept applied to a portable multimedia device, according to one exemplary embodiment.

FIG. 12 is a block diagram illustrating an application example of the inventive concept applied to a portable multimedia device.

Referring to FIG. 12, a portable multimedia device 500 may include an AP 510, a memory device 520, a storage device 530, a communication module 540, a camera module 550, a display module 560, a touch panel module 570 and a poser module 580.

The AP 510 can perform a data processing function.

In FIG. 12, the memory device 520 can be constituted by the semiconductor device such as illustrated in FIGS. 1-5. Thus, a manufacturing cost of a portable multimedia device may be reduced.

The communication module 540 connected to the AP 510 may function as a modem performing functions of communication data transmission and reception and data modulation and demodulation.

The storage device 530 may be embodied by a NOR or NAND type flash memory to store large amounts of data.

The display module 560 may be embodied by a liquid crystal having a backlight, a liquid crystal having a LED light source, or an OLED. The display module 560 functions as an output device displaying an image such as character, number, picture, etc. by color.

The touch panel module 570 can provide a touch input to the AP 510 single-handedly or on the display module 560.

The portable multimedia device is mainly described as a mobile communication device but if necessary, may function as a smart card by adding or subtracting constituent elements.

The portable multimedia device may be connected to an external communication device through a separate interface. The external communication device may be a digital versatile disc (DVD), a player, a computer, a set top box (STB), a game machine, a digital camcorder, etc.

The power module 580 performs a power management of the portable multimedia device. In the case that a PMIC scheme is applied in the portable multimedia device, power saving is accomplished.

The camera module 550 includes a camera image processor (CIS) and is connected to the AP 510.

Although not illustrated in the drawing, the portable multimedia device may be further provided with another application chipset, or a mobile DRAM, etc.

Figure 13:
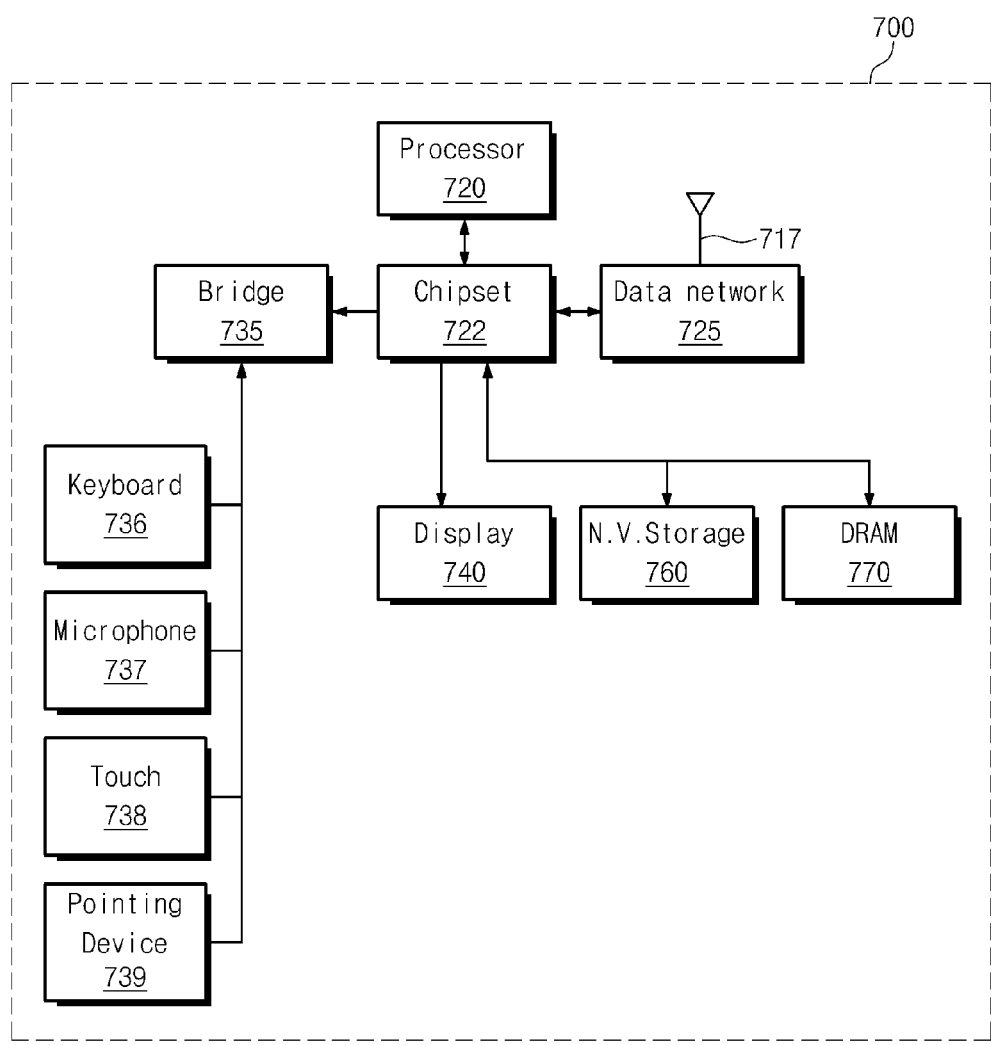
FIG. 13 is a block diagram illustrating an application example of the inventive concept applied to a personal computer, according to one exemplary embodiment.

FIG. 13 is a block diagram illustrating an application example of the inventive concept applied to a personal computer.

Referring to FIG. 13, a personal computer 700 may include a processor 720, a chipset 722, a data network 725, a bridge 735, a display 740, a nonvolatile storage 760, a DRAM 770, a keyboard 736, a microphone 737, a touch unit 738 and a pointing device 739.

In FIG. 13, the DRAM 770 may be manufactured by two or more dies like in FIGS. 1-5. In one embodiment, if at least two dies are equally formed on a wafer through a semiconductor manufacturing process, first and second dies formed so as to have an independent channel are separated from the wafer. After that, the second die is spaced apart from the first die to be disposed in the same package. The dies may be disposed in a mirror die form, in one embodiment.

An internal interface for transmitting a signal between the first and second dies is formed. The first and second dies interconnected through the internal interface may be packaged in a single package.

The chipset 722 can apply a command, an address, data, or a control signal to the DRAM 770.

The processor 720 functions as a host and controls an overall operation of the computing device 700.

A host interface between the processor 720 and the chipset 722 includes various types of protocols for performing a data communication.

The nonvolatile storage 760 may be embodied by an electrically erasable programmable read-only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

The personal computer of FIG. 13 may be changed or extended to an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

Figure 14:
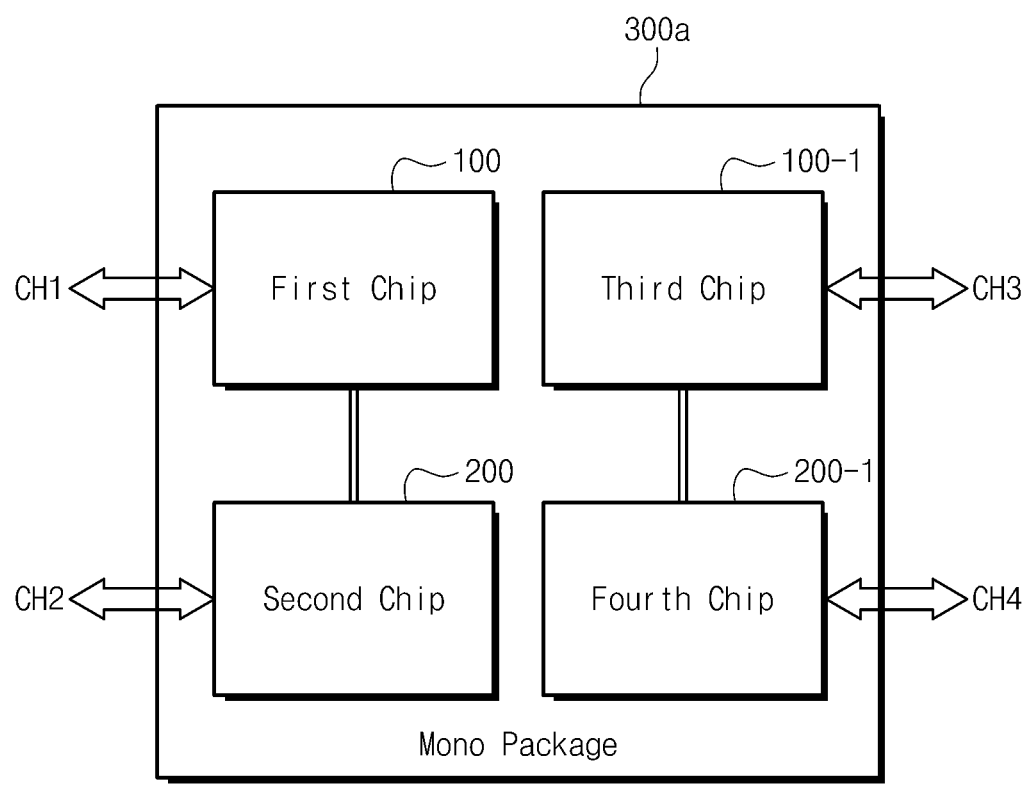
FIG. 14 is a block diagram illustrating a modified embodiment of the semiconductor device of FIG. 1, according to one exemplary embodiment.

FIG. 14 is a block diagram illustrating a modified embodiment of the semiconductor device of FIG. 1.

Referring to FIG. 14, a multi channel semiconductor device 300a includes four chips 100, 200, 100-1 and 200-1 constituted by four dies.

An interconnection for interfacing is formed between the first and second chips 100 and 200 and an interconnection for interfacing is formed between the third and fourth chips 100-1 and 200-1.

The multi channel semiconductor device 300a in a mono package includes 4 channels.

The first chip 100 and the second chip 200 are constituted by two dies and perform the same data input/output operation as the 2 channel semiconductor memory device manufactured in a mono die.

The third chip 100-1 and the fourth chip 200-1 are constituted by two dies and perform the same data input/output operation as the 2 channel semiconductor memory device manufactured in a mono die.

Figure 15:
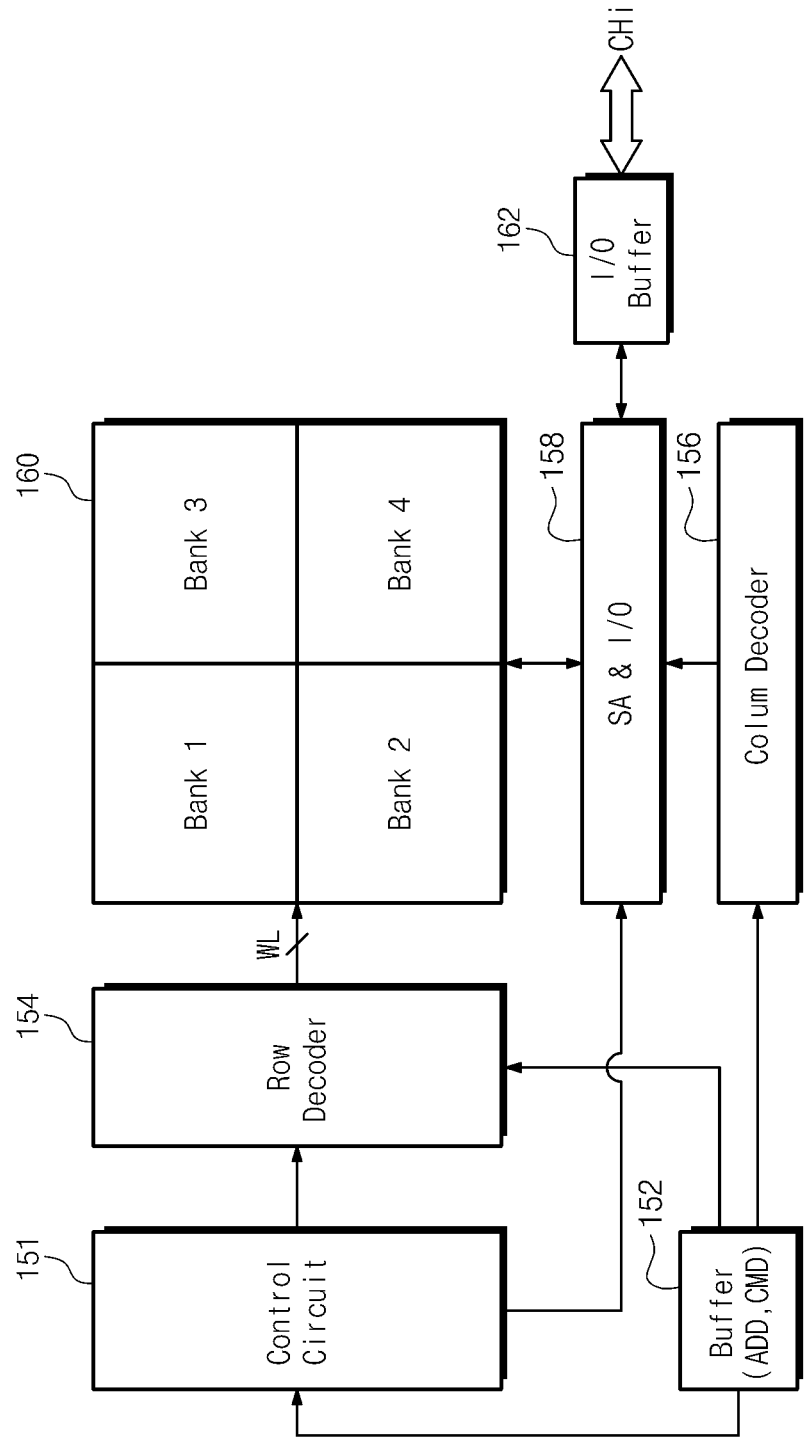
FIG. 15 is a block diagram illustrating an internal constitution of one chip of FIG. 14, according to one exemplary embodiment.

FIG. 15 is a block diagram illustrating an internal constitution of one chip of FIG. 14, according to one exemplary embodiment.

Referring to FIG. 15, the first chip 100 may have a block constitution such as illustrated in FIG. 14.

The first chip 100 may include a memory cell array 160, a sense amplifier & input/output circuit 158, an I/O buffer 162, a buffer 152, a low decoder 154, a column decoder 156, and a control circuit 151.

The memory cell array 160 may be constituted by DRAM memory cells constituted by one access transistor and on storage capacitor. The memory cells may be arranged in rows and columns. In the drawing, the memory cell array 160 is divided into 4 banks but this is only illustrative. The memory cell array 160 may be designed by at least one bank.

The control circuit 151 receives a control signal and an address signal being applied to generate an internal control signal for controlling operation modes set.

The buffer 152 receives an address being applied to perform a buffering. In response to the internal control signal, the buffer 152 provides a row address of selecting a row of the memory cell array 160 to the row decoder 154 and provides a column address of selecting a column of the memory cell array 160 to the column decoder 156.

The buffer 152 receives a command being applied to perform a buffering. The command is applied to the control circuit 151 to be decoded.

The row decoder 154 decodes the row address in response to the internal control signal. If a result of row address decoding is applied to the memory cell array 160, a selected word line among a plurality of word lines connected to memory cells is driven.

The column decoder 156 decodes the column address in response to the internal control signal. A column gating is performed according to a decoded column address. As a result of the column gating, a selected bit line among bit lines connected to memory cells is driven.

The sense amplifier & input/output circuit 158 detects a potential being appeared on a bit line of the selected memory cell to sense data stored in the selected memory cell.

The I/O buffer 162 buffers data being input. In a read operation mode, the I/O buffer 162 buffers data read out from the sense amplifier & input/output circuit 158 to output the buffered data to a channel CHi.

According to some embodiments of the inventive concept, since information is transmitted to counterpart dies through an internal interface, a multi channel semiconductor device is embodied by two or more mono dies. Thus, as compared with a multi channel semiconductor device embodied by one mono die, manufacturing yield is improved and thereby a manufacturing cost is reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
    a package substrate;
    a first die on the package substrate having a first channel to function as a first chip and a first pad to receive control information for controlling the first die;
    a second die on the package substrate having a second channel to function as a second chip and a second pad to receive the control information, for controlling the second die, wherein the control information is applied to one of the first die and the second die, wherein the second channel is different from the first channel and the second die has same storage capacity and physical size as the first die; and
    an internal interface that connects the first and second dies, the internal interface configured to transmit the control information to the second die when the control information is applied to the first die and transmit the control information to the first die when the control information is applied to the second die,
    wherein the second die is mounted on the package substrate to be horizontally adjacent the first die.

2. The semiconductor device of claim 1, wherein the control information is one of a reset signal for resetting operations of the first and second dies and a ZQ signal for ZQ calibration operations of the first and second dies.

3. The semiconductor device of claim 1, wherein the semiconductor device is configured such that:
    information from outside the semiconductor device having a first type is transmitted to the first die through the first channel without passing between the first die and the second die, and is transmitted to the second die through the second channel without passing between the first die and the second die; and
    the control information for controlling internal operations of the first and second dies is a different type of information from the first type.

4. A semiconductor package comprising:
    a package substrate;
    a first die on the package substrate having a first channel to function as a first chip and a first pad to receive control information, the control information for controlling the first die;
    a second die on the package substrate having a second channel to function as a second chip and a second pad to receive the control information, for controlling the second die, wherein the control information is applied to one of the first die and the second die, wherein the second channel is different from the first channel and the second die has same storage capacity and physical size as the first die; and an internal interface that connects the first and second dies, the internal interface configured to transmit the control information to the second die when the control information is applied to the first die and transmit the control information to the first die when the control information is applied to the second die, wherein the first die is horizontally adjacent the second die, and wherein each of said first and second dies are configured to (a) receive first information from outside the semiconductor package without the first information physically passing through the other of the first and second dies to arrive at said first or second die, and (b) receive second information from the other of the first and second dies.

5. A semiconductor package comprising:

a package substrate;

a first chip mounted on the substrate;

a second chip mounted on the substrate to be horizontally adjacent the first chip;

a first channel connected to the first chip for receiving a first type of information at the first chip;

a second separate channel connected to the second chip for receiving the first type of information at the second chip; and an internal interface connected between the first chip and the second chip, the internal interface configured to transmit a second type of information different from the first type from a buffer of the first or second chip to the other of the first or second chip, wherein the second type of information is used by both the first chip and the second chip, wherein the internal interface is a conductive line extending along the package substrate between the first chip and the second chip, and connecting first terminals of the first chip to second terminals of the second chip.

6. The semiconductor package of claim 5, wherein:

the first type of information is read/write access information; and the second type of information is operation control information applied to both the first chip and the second chip to control operation of the respective chips.

7. The semiconductor package of claim 6, wherein:

the second type of information relates to a reset command or a ZQ command.

8. The semiconductor package of claim 5, wherein the semiconductor package is configured such that:

information having the first type is transmitted to the first chip through the first channel without passing between the first chip and the second chip, and is transmitted to the second chip through the second channel without passing between the first chip and the second chip.

9. The semiconductor package of claim 8, wherein:

the second type of information is operation control information for the first and second chips.

10. The semiconductor package of claim 5, further comprising:

a control circuit on at least one of the first and second chips, and configured to receive information of the second type.

* * * * *